(12) United States Patent
Yanagisawa

(10) Patent No.: US 7,687,317 B2
(45) Date of Patent: Mar. 30, 2010

(54) SEMICONDUCTOR DEVICE HAVING TAPE CARRIER WITH BENDABLE REGION

(75) Inventor: Masahiko Yanagisawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/053,114

(22) Filed: Mar. 21, 2008

(65) Prior Publication Data

US 2008/0237815 A1    Oct. 2, 2008

(30) Foreign Application Priority Data

Mar. 29, 2007    (JP) .............................. 2007-088237

(51) Int. Cl.
*H01L 23/495* (2006.01)
*H01L 21/00* (2006.01)
*H01L 21/60* (2006.01)

(52) U.S. Cl. ............... 438/111; 257/668; 257/E21.001; 257/E23.031

(58) Field of Classification Search ................ 257/668, 257/E21.001, E23.031; 438/111
See application file for complete search history.

(56) References Cited

U.S. PATENT DOCUMENTS

| | | | |
|---|---|---|---|
| 6,441,063 B1 | 8/2002 | Kudo et al. | |
| 6,441,476 B1 * | 8/2002 | Emoto | ........................ 257/686 |
| 6,489,331 B1 | 12/2002 | Shimada et al. | |
| 6,509,630 B1 | 1/2003 | Yanagisawa | |
| 2007/0023877 A1 * | 2/2007 | Yamazaki | .................... 257/668 |

FOREIGN PATENT DOCUMENTS

| | | |
|---|---|---|
| JP | A 10-289931 | 10/1998 |
| JP | A 2000-269249 | 9/2000 |
| JP | A 2000-286309 | 10/2000 |
| JP | 2001-028478 | * 1/2001 |
| JP | A 2001-298056 | 10/2001 |
| JP | 2003-197690 | * 7/2003 |
| JP | A 2004-235322 | 8/2004 |
| WO | WO 00/48243 | 8/2000 |
| WO | WO 00/54323 | 9/2000 |
| WO | WO 0054324 | 9/2000 |

* cited by examiner

*Primary Examiner*—Matthew Smith
*Assistant Examiner*—Walter H Swanson
(74) *Attorney, Agent, or Firm*—Oliff & Berridge, PLC

(57) ABSTRACT

A tape carrier includes: a base film with insulating property; a wiring pattern provided on the base film within a product region, the product region being demarcated by a cutting line so as to divide the tape carrier into individual products by cutting along the tape carrier along the cut line; and a solder resist provided on the base film so as to cover the wiring pattern. The solder resist protrudes outward from within the product region.

3 Claims, 5 Drawing Sheets

SEMICONDUCTOR DEVICE HAVING TAPE CARRIER WITH BENDABLE REGION

The entire disclosure of Japanese Patent Application No. 2007-088237, filed Mar. 29, 2007 is expressly incorporated by reference herein.

BACKGROUND

1. Technical Field

The present invention relates to a tape carrier, a semiconductor device, and a method for manufacturing semiconductor device.

2. Related Art

Size and weight reduction of electric products such as liquid crystal panels and mobile terminals is advancing. These electric products include integrated circuit devices, and these devices packaged inside cases are generally mounted on insulating film substrates that can be bended easily, for instance, by hand. These film substrates are formed with, for instance, polyimide, and are called tape carriers or flexible substrates. Packaged products including integrated circuit devices mounted on such tape carriers are called tape carrier packages (TCP), chip on films (COF), or flexible print circuits (FPC). Refer to JP-A-2004-235322 and JP-A-2000-269249 for examples.

FIGS. 4A and 4B are plan views showing an example of a structure of a tape carrier 200 according to an example of a related art. FIG. 4A illustrates a status before stamping the long tape carrier 200 along cut lines 251 which are the outlines of the final product regions. The tape carrier 200 includes an insulating base film 201, inner and outer leads (hereafter referred to as "leads") 203 provided thereon, and solder resists 205 which mainly cover the inner leads.

Each of the solder resists 205 covering the leads 203 is formed with resin by coating a base film 201 in a state before forming the leads 203, using dispensing or screen printing, and thereafter curing it (i.e. carrying out heat treatment). Here, since the solder resist 205 before being cured is in a liquid state with a certain degree of viscosity, the edge of the fluid rises by the effect of the surface tension during the steps of coating to curing. In other words, as shown in FIG. 4B, a part in each of the solder resists 205, positioned inward from the edge thereof by approximately 0.5 to 0.8 mm, is thicker compared to the center part, resulting in a problem of unevenness in film thickness. Since the solder resists 205 are translucent, the uneven film thickness tends to cause color irregularities, i.e., defect in the outer appearance.

Moreover, as shown in FIG. 5, subsequent to packaging an integrated circuit (IC) device 211 and stamping the tape carrier 200 along the cut lines 251, the tape carrier 200 is bended at a bending line 261. At this time, a thick film portion 205a in each of the solder resists 205 behaves like a core, preventing a smooth bending. In particular, if the thicknesses of the thick solder resist portions 205a are uneven, the tape carrier tends to bend at a portion in the thick solder resist portions 205a which are thinner and weaker. This results in the irregularities of bending, i.e., defect in bending.

SUMMARY

An advantage of some aspects of the invention is to provide: a tape carrier that improves the properties of outer appearance and of bending; a semiconductor device; and a method for manufacturing the semiconductor device.

According to a first advantage of the invention, a tape carrier includes a base film with insulating property; a wiring pattern provided on the base film within a product region, the product region being demarcated by a cutting line so as to divide the tape carrier into individual products by cutting the tape carrier along the cut line; and a solder resist provided on the base film so as to cover the wiring pattern. The solder resist protrudes outward from within the product region.

With this structure, the tape carrier can be bended easily with less resistance, by arranging the bending line which is the bending axis so as to cover "a portion protruding outward from inside the product region" of the solder resist in plan view, at the time of bending and packaging the tape carrier into a case of an electric product after the tape carrier is divided into individual products. Moreover, compared to the common tape carrier, there are less thick film portions in the solder resist, improving the outer appearance.

In this case, the product region includes a bendable region having a bending line as an axis; and the solder resist is formed to protrude outward from within the product region, so as to overlap with the bending line in plan view, With this structure, the core (i.e. the thick film portion of the solder resist) which is resistant to the bending of the tape carrier after cutting the tape carrier is made smaller or is not present. Therefore, the tape carrier is bended easily. Moreover, this improves the uniformity in the film thickness of the solder resists in the product region, thereby also improving the evenness in a stress distribution of the solder resists during the bending. Consequently, fluctuation in the manner of bending the tape carrier is reduced.

In this case, an edge of the solder resist is pulled out to the outside of the product region so that a thick film portion of the solder resist overlapping with the bending line in plan view is present only on the outside of the product region, and not on the cutting line nor inside the product region.

With this structure, when bending a tape carrier after dividing it, the core part (i.e. the thick film portion of the solder resist) which becomes resistant to bending is eliminated almost completely. Therefore, the tape carrier is bended easily enough, and the fluctuation in the manner of bending the tape carrier is sufficiently reduced.

According to a second aspect of the invention, a method for manufacturing a semiconductor device includes: installing an integrated circuit device on the tape carrier according to the first aspect of the invention; and cutting the tape carrier along the cutting line so as to divide the tape carrier into individual products.

The tape carrier according to the first aspect of the invention is applied in this method, and thus it is possible to provide the semiconductor device which is easy to bend, with less fluctuation in the manner of bending the tape carrier when packaging it into a case of an electric product.

According to a third aspect of the invention, a semiconductor device includes: a base film with insulating property; a wiring pattern provided on the base film; and a solder resist provided on the base film so as to cover the wiring pattern. The base film includes a bendable region having a bending line as an axis. A thick film portion of the solder resist is present on the base film in a region not including the bendable region, the thick film portion of the solder resist being not present on the base film in the bendable region.

With this structure, since the thick film portion of the solder resist functions as a resistance against bending (i.e. a core), the strength of the tape carrier is improved in a region which is not a bendable region (i.e. in a region that should not be bended).

In this case, the thick film portion of the solder resist present in the area excluding the bendable region is formed to be parallel to the bending line.

With this structure, the resistance against the bending of the tape carrier is reduced in the direction for bending, and improved in the direction that should not be bended.

According to a fourth aspect of the invention, a semiconductor device includes: a base film with insulating property, the base film including a bending region bended at a bending line; a wiring pattern provided on the base film; and a solder resist provided on the base film so as to cover the wiring pattern, the solder resist having a first portion and a second portion, the first portion being provided on the bending region of the base film, the second portion being provided on the base film excluding the bending region, a thickness of the first portion of the solder resist being even, the second portion of the solder resist having a portion thicker than the first portion.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with references to the accompanying drawings.

Figure 1:
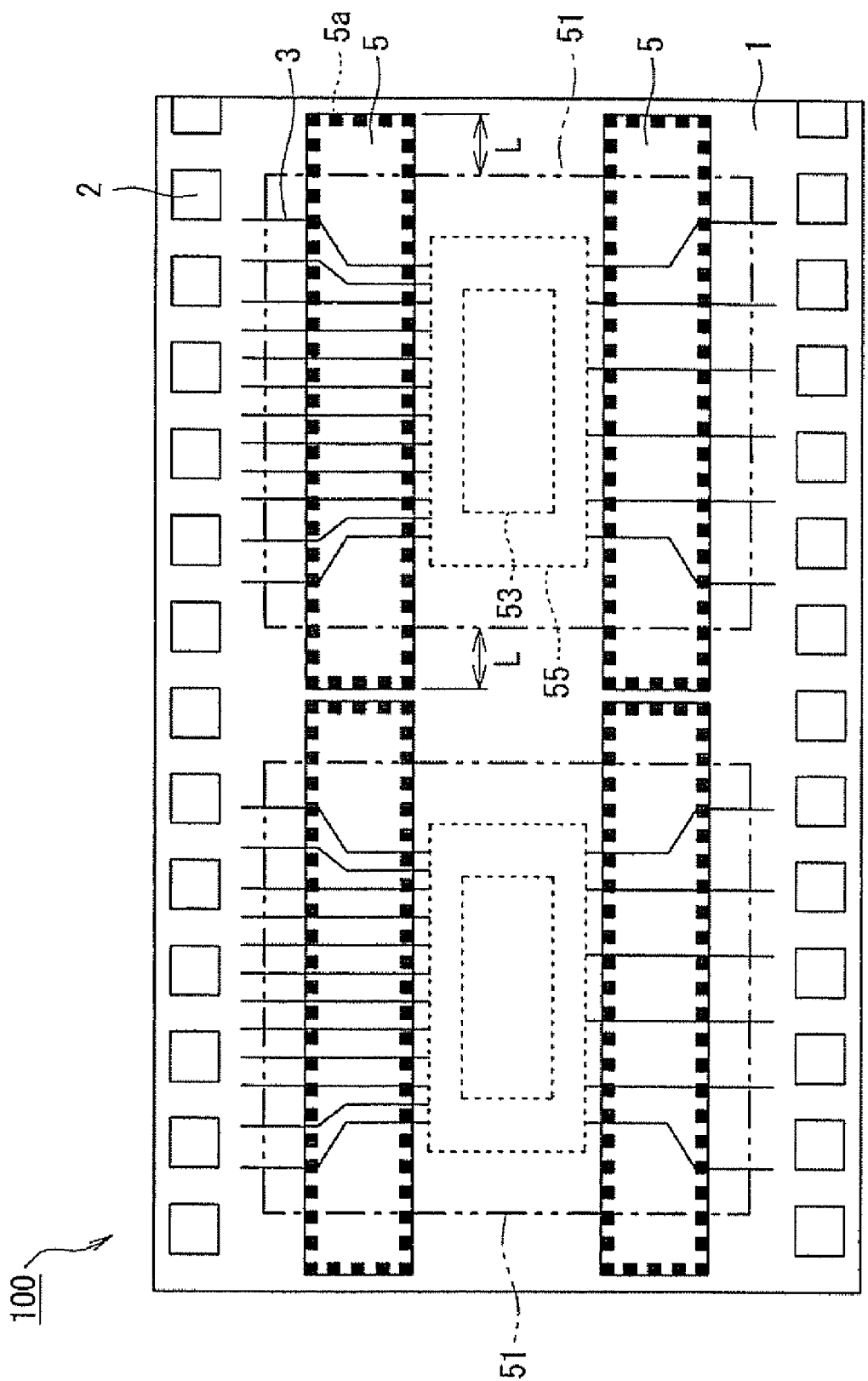
FIG. 1 is a plan view illustrating an example of a structure of a tape carrier according to an aspect of the invention.
Figure 2:
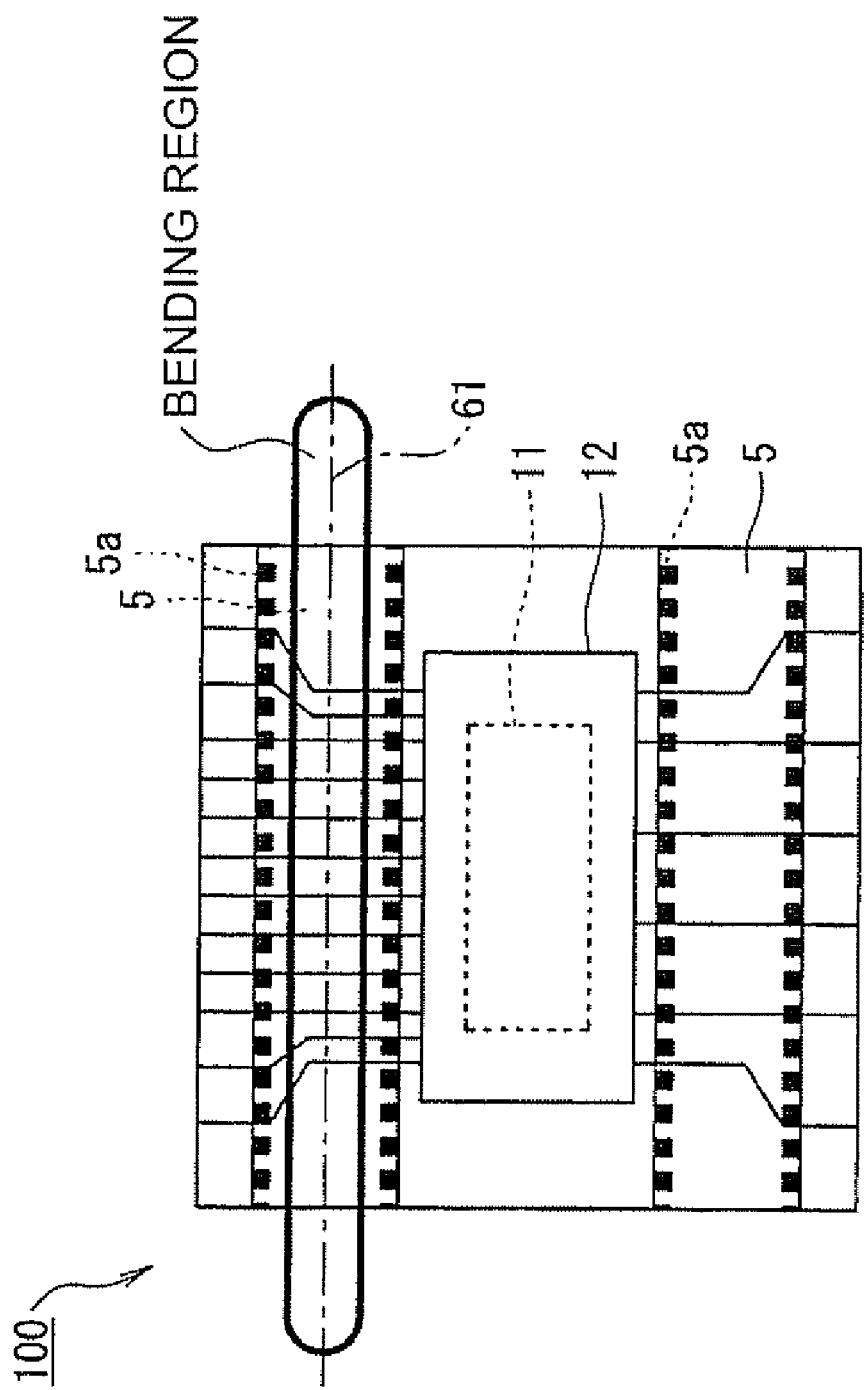
FIG. 2 is a drawing of the tape carrier after stamping (dividing).

FIGS. 1 and 2 are plan views illustrating an example of a structure of a tape carrier 100 according to one embodiment of the invention. Specifically, FIG. 1 indicates a state of the tape carrier 100 before stamping the tape carrier along cut lines 51 that demarcate a production region. The double dotted lines in FIG. 1 are the cut lines 51 and regions surrounded thereby are product regions. Moreover, FIG. 2 indicates the tape carrier 100 divided into individual products by stamping the tape carrier 100 along the cut lines 51.

As shown in FIG. 1, the tape carrier 100 includes, in a state prior to being stamped, a long base film 1, sprocket holes 2 provided on a side edge in the longitudinal direction of the base film 1, inner and outer leads (hereafter referred to as "leads") 3, and solder resists 5 coated on the tape carrier 100 so as to cover these leads 3. The base film 1 is formed with an insulating material such as polyimide, and the leads 3 are formed with metallic thin film such as copper film. As shown in FIG. 1, the internal product region includes regions in which IC devices are installed (IC installation regions 53), and regions on which resin for sealing the IC devices is coated (resin regions 55).

When manufacturing a semiconductor device using this tape carrier 100, an IC device 11 (refer to FIG. 2) is installed in each of the IC installation regions 53, and thereafter an epoxy resin 12 (refer to FIG. 2) is coated on each of the resin regions 55, so as to seal the IC device 11 with resin. Subsequently, the tape carrier 100 is stamped along the cut lines 51 using a die, so as to be divided into individual products.

This tape carrier 100 includes, similar to the related art described above, a bendable region (bending region) for storing the divided tape carrier into a case of electric product and the like. In this embodiment, this bending region includes an improvement in a structure that the solder resists 5 protrude outward from within the product region to the outside along the bending line 61 described above.

In other words, the solder resists 5 overlapping with the bending region are formed protruding outward from the two sides of the product region. Each distance L protruding outward from each of the two sides of the product region is sufficiently long enough for each of the thick film portions 5a at the edge of the solder resists 5 to be formed, by curing, only in a region outside of the product region which overlaps with the bending region, and not inside of the product region. For instance, according to an experiment carried out by the inventor, the thick film portions 5a were completely excluded from the bending region after dividing the tape carrier, by setting the distance L to be equal to or greater than 0.8 mm. The optimal value of the distance L changes in accordance with the type of the solder resists 5 and the condition of curing. Therefore, when embodying the aspects of the invention, it is preferable that the optimal value of the distance L is obtained by carrying out experiments for various types of solder resists in various curing conditions.

As described, according to the embodiment, the bending region does not include the core parts (i.e. the thick film portions 5a of the solder resists 5) which become resistant to the bending of the already-divided tape carrier 100. Therefore, the tape carrier 100 is bended easily. Moreover, this improves the uniformity of the film thickness of the solder resists 5 in the product region, thereby reducing the irregularities of the film thicknesses. Further, improving the evenness of stress distribution during the bending of the solder resists 5a reduces the difference in how the tape carrier 100 is bended.

According to the embodiment, the thick film portions 5a of the solder resists 5 are formed, by curing, also in the product regions positioned away from the bending region as shown in FIG. 1. The thick film portions 5a deviated from this bending region remain on the base film 1 as is, after dividing the tape carrier 100 as shown in FIG. 2. Here, the thick film portions 5a positioned away from this bending region are parallel to the bending line 61. Therefore, when a force works to bend the tape carrier 100 in a direction orthogonal to the bending line after the tape carrier 100 is divided, the thick film portions 5a function as resisting bodies (i.e. cores) against bending.

As described, the resisting force of the tape carrier 100 against bending can be weakened in the direction of bending, and strengthened in the direction in which the bending should be avoided, since the thick film portions 5a remain parallel to the bending line.

In the first embodiment, each of the cut lines 51 correspond to 'a cutting line' according to the aspects of the present invention, and each of the leads 3 correspond to 'a wiring pattern' according to the aspects of the present invention.

Figure 3:
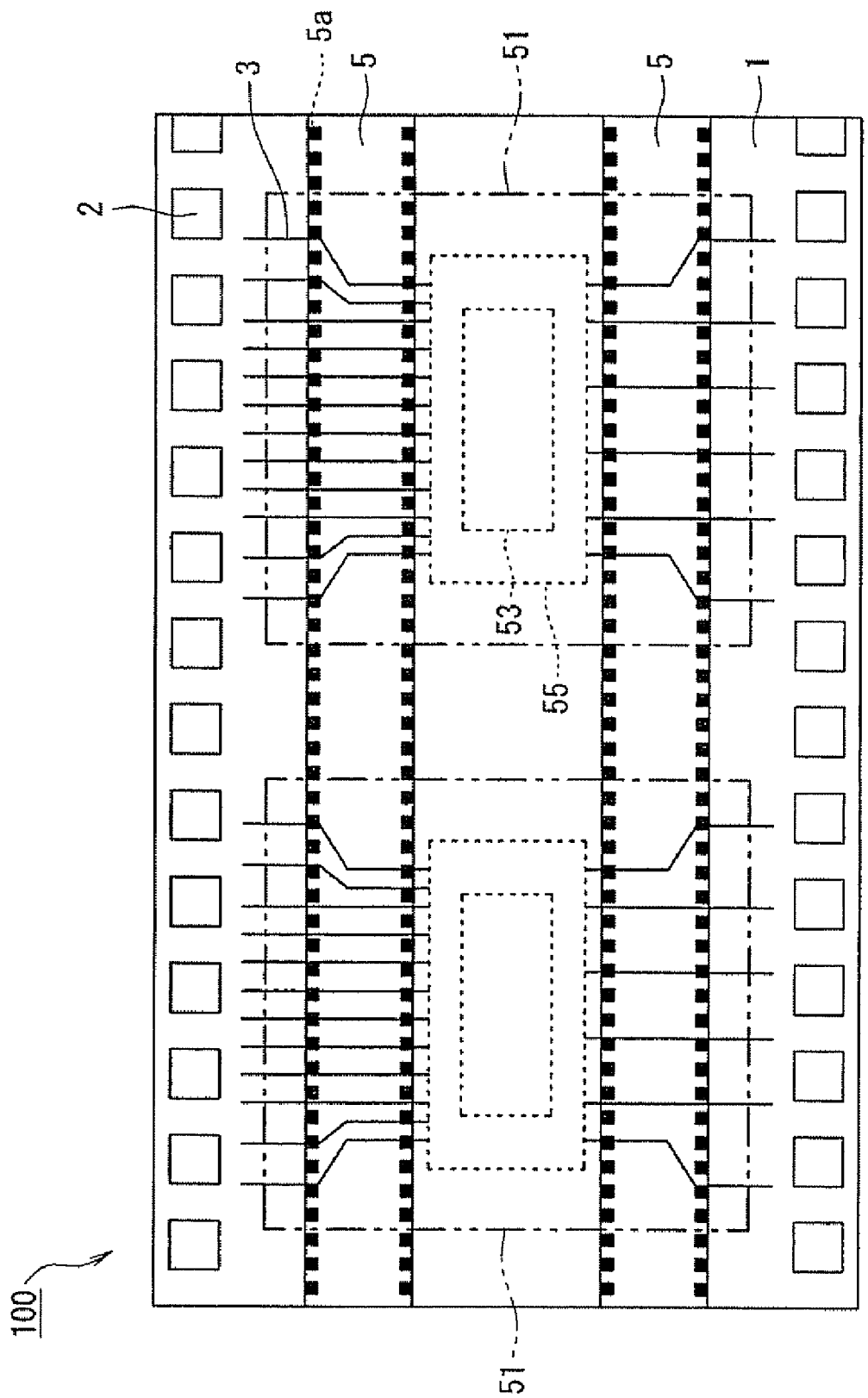
FIG. 3 is a drawing illustrating another example of the tape carrier.
Figure 4A:
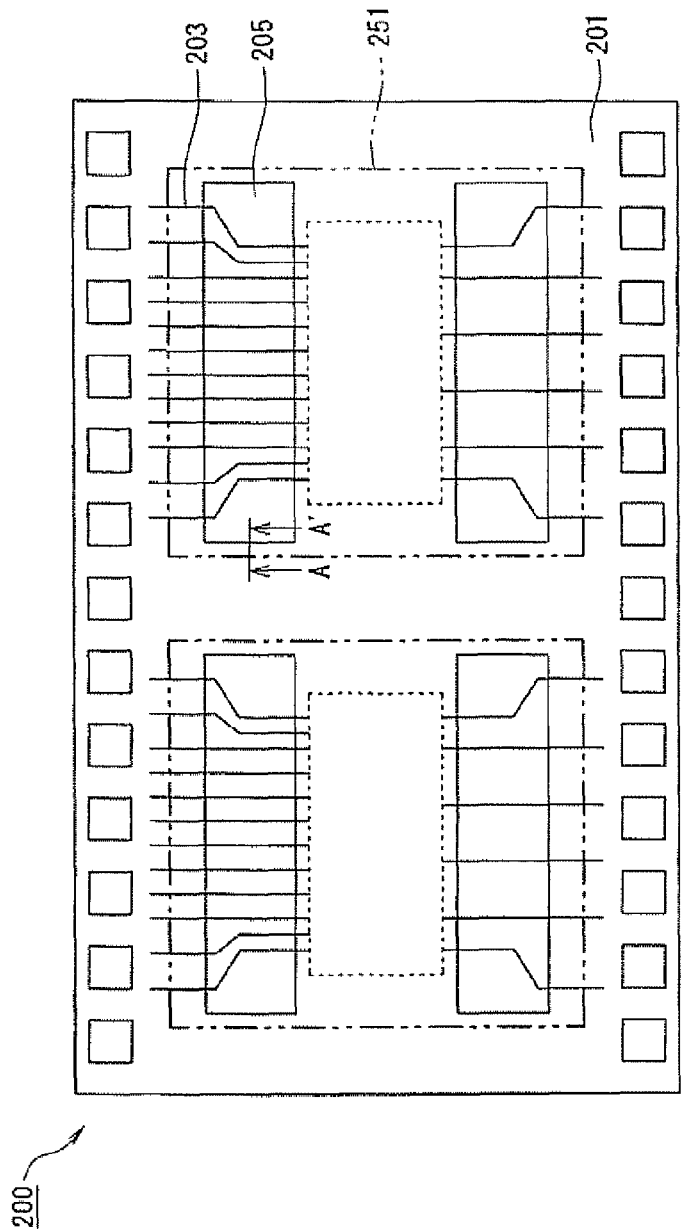
FIGS. 4A and 4B are drawings illustrating an example of a structure of a common tape carrier.
Figure 4B:
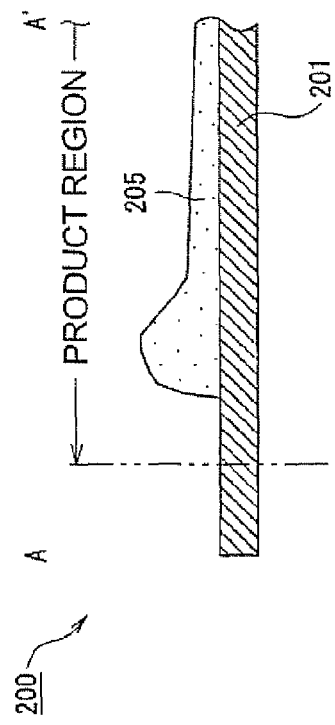
Figure 5:
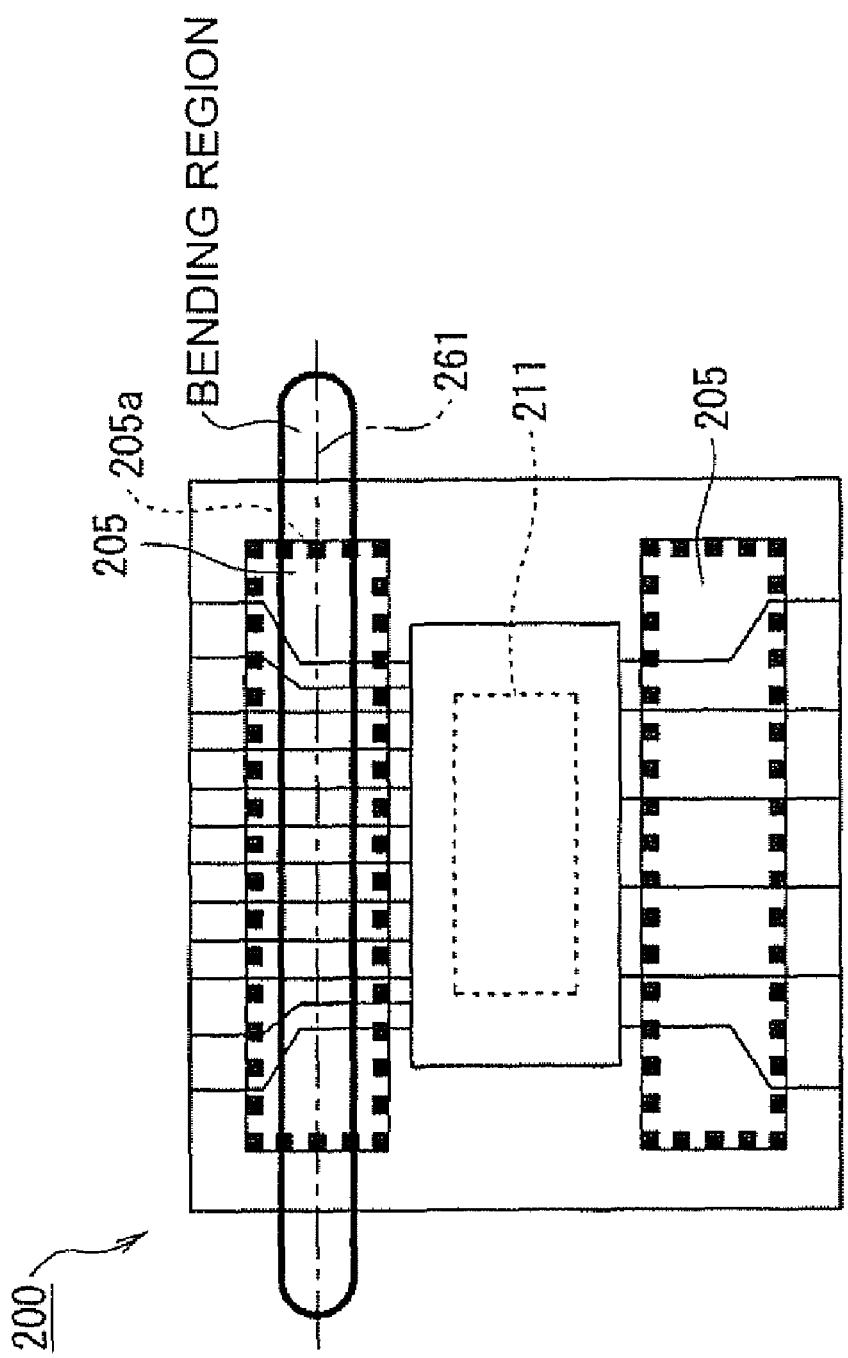
FIG. 5 is a drawing of the tape carrier after stamping (dividing).

In the above embodiment, the solder resists 5 are formed on the base film 1 before stamping, so as to space the two adjacent production regions, as shown in FIG. 1. However, the alignment of the solder resists 5 in plan view is not limited thereto. For instance, as shown in FIG. 3, the solder resists 5 may be formed continuously without spaces between the product regions, along the longitudinal direction of the base film 1. The thick film portions 5a of the solder resists 5 are not formed in the bending region in this structure. Therefore, an advantage similar to that of the tape carrier 100 shown in FIGS. 1 and 2 is obtained.

In the above embodiment, as shown in FIG. 1, the IC installation regions 53 are aligned along the longitudinal direction of the base film 1, and the leads 3 are aligned in a direction orthogonal to the longitudinal direction of the base film 1. In other words, the product regions are aligned in a direction orthogonal to the longitudinal direction of the base film 1. However, the IC installation regions 53 may be extended to a direction orthogonal to the longitudinal direction of the base film 1, and the leads 3 may be aligned in a longitudinal direction of the base film 1. In other words, the product regions are aligned along the longitudinal direction of the base film 1.

What is claimed is:

1. A semiconductor device, comprising:
   a base film with insulating property;
   a wiring pattern provided on the base film; and
   a solder resist provided on the base film so as to cover the wiring pattern,
   the base film including a bendable region on the base film, the bendable region having a bending line as an axis, and
   a thick film portion of the solder resist, as compared to the solder resist portion of the bending region, being present on the base film in a region not including the bendable region.

2. The semiconductor device according to claim 1, wherein the thick film portion of the solder resist present in the area excluding the bendable region is formed to be parallel to the bending line.

3. A semiconductor device, comprising:
   a base film with insulating property, the base film including a bending region bended at a bending line;
   a wiring pattern provided on the base film; and
   a solder resist provided on the base film so as to cover the wiring pattern, the solder resist having a first portion and a second portion, the first portion being provided on the bending region of the base film, the second portion being provided on the base film excluding the bending region, a thickness of the first portion of the solder resist being even, the second portion of the solder resist having a portion thicker than the first portion.

* * * * *